United States Patent
Tung et al.

(10) Patent No.: US 11,374,010 B2
(45) Date of Patent: Jun. 28, 2022

(54) MEMORY DEVICE AND METHOD OF FABRICATING SAME

(71) Applicant: FUJIAN JINHUA INTEGRATED CIRCUIT CO., LTD., Fujian (CN)

(72) Inventors: Yu-Cheng Tung, Fujian (CN); Qinfu Zhang, Fujian (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 17/288,773

(22) PCT Filed: Jul. 29, 2020

(86) PCT No.: PCT/CN2020/105418
§ 371 (c)(1),
(2) Date: Apr. 26, 2021

(87) PCT Pub. No.: WO2021/109595
PCT Pub. Date: Jun. 10, 2021

(65) Prior Publication Data
US 2022/0037327 A1   Feb. 3, 2022

(30) Foreign Application Priority Data
Apr. 29, 2020  (CN) .......................... 202010353686.8

(51) Int. Cl.
*H01L 27/108*   (2006.01)

(52) U.S. Cl.
CPC .. *H01L 27/10814* (2013.01); *H01L 27/10823* (2013.01); *H01L 27/10855* (2013.01)

(58) Field of Classification Search
None
See application file for complete search history.

(56) References Cited

U.S. PATENT DOCUMENTS

| | | | |
|---|---|---|---|
| 11,074,965 B2* | 7/2021 | Wang | ................ H01L 27/10805 |
| 11,289,153 B2* | 3/2022 | Wang | .................... H01L 27/108 |
| 2017/0076974 A1* | 3/2017 | Choi | ...................... H01L 27/228 |

(Continued)

FOREIGN PATENT DOCUMENTS

| | | | |
|---|---|---|---|
| CN | 106847754 A | | 6/2017 |
| CN | 107845633 A | * | 3/2018 |

(Continued)

*Primary Examiner* — Steven M Christopher
(74) *Attorney, Agent, or Firm* — Winston Hsu

(57) ABSTRACT

A memory device and a method of fabricating the memory device are disclosed, in which a plurality of contacts are formed on a substrate, and voids are formed in the contacts. The contacts are electrically isolated from one another by cutouts directly connecting with the voids. Insulating layers at least fill the cutouts. Since the cutouts are connected with the voids and the insulating layers fill at least the cutouts, the voids can be kept at least partially void. Thus, they can reduce parasitic capacitance between the contacts, prevent the degradation of data retention properties of the memory device, and overcome the problem of malfunctioning. Additionally, the need to avoid the formation of voids in the contacts by imposing strict requirements on the process for forming the contacts can be dispensed with, thus widening the process window for the formation of the contacts.

19 Claims, 5 Drawing Sheets

(56) References Cited

U.S. PATENT DOCUMENTS

| | | | | |
|---|---|---|---|---|
| 2019/0157275 A1* | 5/2019 | Lee | ................... | H01L 21/76834 |
| 2019/0296019 A1* | 9/2019 | Wu | ................... | H01L 27/10888 |
| 2020/0066729 A1* | 2/2020 | Simsek-Ege | ...... | H01L 27/10814 |

FOREIGN PATENT DOCUMENTS

| | | | | | |
|---|---|---|---|---|---|
| CN | 108206184 A | | 6/2018 | | |
| CN | 109979940 A | | 7/2019 | | |
| CN | 110718550 A | | 1/2020 | | |
| CN | 210110766 U | | 2/2020 | | |
| CN | 111463208 A | | 7/2020 | | |
| CN | 212991098 U | * | 4/2021 | ......... | G11C 11/4097 |

* cited by examiner

MEMORY DEVICE AND METHOD OF FABRICATING SAME

TECHNICAL FIELD

The present invention relates to the fabrication of semiconductor devices and, in particular, to a memory device and a method of fabricating such a device.

BACKGROUND

A memory device, such as a dynamic random access memory (DRAM) device, usually includes: a plurality of memory cells arranged in an array; a plurality of bit lines each electrically connected to corresponding ones of the memory cells; and capacitors, which are configured to store electrical charges representing stored information and are electrically connected to the memory cells via node contacts in order to allow the individual memory cells to perform their storage function.

With the increasing miniaturization of semiconductor devices, such capacitors have a smaller and smaller cross-sectional area along their transverse direction (the horizontal direction parallel to the substrate surface). On the other hand, in order to ensure sufficient capacitance, they must have an increased longitudinal dimension (i.e., the height perpendicular to the substrate surface) for accounting for the reduced area. This requires the node contacts electrically connected to the capacitors to accordingly have an increased height, which, however, will raise difficulties in their fabrication. In addition, adjacent node contacts will be brought closer to one another, leading to increased parasitic capacitance. All of these will degrade the capacitors' data retention properties and may cause other problems such as malfunctioning.

SUMMARY OF THE INVENTION

In order to overcome the problem of large parasitic capacitance between adjacent node contacts, it is an objective of the present invention to provide a memory device and a method of fabricating the memory device.

To this end, the present invention provides a memory device including:
 a substrate;
 a plurality of contacts, extending upward from the substrate and each containing at least one void formed therein;
 a plurality of cutouts positioned between adjacent two of the plurality of contacts to separate apart the adjacent two of the plurality of contacts, and the plurality of cutouts directly connecting with the voids; and
 an insulating layer filling at least the plurality of cutouts.

Optionally, the insulating layers may cover connections between the voids and the plurality of cutouts, or the insulating layer may cover connections between the voids and the plurality of cutouts and partially fill the voids.

Optionally, the insulating layer may further completely fill the voids.

Optionally, each of the plurality of contacts may be formed therein with a first void and a second void, the first void having a bottom higher than a top of the second void, and wherein the plurality of cutouts are directly connected with at least the first voids.

Optionally, each of the plurality of cutouts may have a bottom lower than the bottom of the connected first void.

Optionally, each of the plurality of cutouts may have a bottom higher than the bottom of the corresponding first void and higher than the top of the corresponding second void.

Optionally, the memory device may further include:
 spacing insulation pillars extending in a first direction between the substrate and the plurality of cutouts; and
 bit lines extending in a second direction between the substrate and the plurality of cutouts,
 wherein the plurality of contacts are formed in respective contact windows delimited by the spacing insulation pillars and the bit lines, and wherein in a direction perpendicular to a height-wise direction, the spacing insulation pillars are staggered with respect to respective corresponding ones of the plurality of cutouts and the bit lines are also staggered with respect to respective corresponding ones of the plurality of cutouts.

Optionally, each of the plurality of contacts may be divided into an upper contact portion and a lower contact portion at a height level corresponding to bottoms of the plurality of cutouts, the upper contact portion having a maximum width greater than a maximum width of the lower contact portion in the direction perpendicular to the height-wise direction.

To this end, the present invention also provides a method of fabricating a memory device, which includes:
 providing a substrate;
 forming a plurality of contacts on the substrate, the plurality of contacts extending upward from the substrate and each containing at least one void formed therein;
 forming a plurality of cutouts, each positioned between adjacent two of the plurality of contacts to separate apart the adjacent two of the plurality of contacts, and the plurality of cutouts directly connecting with the voids; and forming an insulating layer in the plurality of cutouts, the insulating layer filling at least the plurality of cutouts.

Optionally, during the formation of the insulating layer in the plurality of cutouts, the insulating layer may cover connections between the voids and the plurality of cutouts, or the insulating layer may cover connections between the voids and the plurality of cutouts and partially fill the voids.

Optionally, during the formation of the insulating layer in the plurality of cutouts, the insulating layer may further completely fill the voids.

Optionally, each of the plurality of contacts may be formed therein with a first void and a second void, the first void having a bottom higher than a top of the second void, and wherein the plurality of cutouts are directly connected with at least the first voids.

Optionally, each of the plurality of cutouts may have a bottom lower than the bottom of the connected first void.

Optionally, each of the plurality of cutouts may have a bottom higher than the bottom of the corresponding first void and higher than the top of the corresponding second void.

Optionally, the contacts and cutouts may be formed simultaneously, and the formation of the contacts and cutouts may include the steps of:
 forming a conductive material layer on the substrate, the conductive material layer containing the voids; and
 forming the plurality of cutouts by etching the conductive material layer, the plurality of cutouts directly connected with the voids, the plurality of cutouts separating apart remaining portions of the conductive material layer, which form the plurality of contacts.

Optionally, the method may further include: forming a plurality of spacing insulation pillars extending in a first direction and a plurality of bit lines extending in a second direction are on the substrate, the plurality of spacing insulation pillars and the plurality of bit lines together delimiting the contact windows;

forming a conductive material layer over the substrate, which fills the contact windows and extends over tops of the plurality of bit lines and of the plurality of spacing insulation pillars, wherein the voids are located in portions of the conductive material layer filled in the contact windows; and forming the plurality of cutouts by etching the conductive material layer, wherein the etching includes etching away portions of the conductive material layer, partially etching away upper portions of the plurality of spacing insulation pillars and partially etching away upper portions of the plurality of bit lines, wherein in a direction perpendicular to a height-wise direction, the plurality of spacing insulation pillars are staggered with respect to respective corresponding ones of the plurality of cutouts and the plurality of bit lines are also staggered with respect to respective corresponding ones of the plurality of cutouts, thus bringing the plurality of cutouts directly connected with the voids.

In the provided memory device and method, the plurality of node contacts containing the voids formed therein are formed on the substrate and electrically isolated from one another by the cutouts connected with the voids, with the insulating layers filling at least the cutouts. According to the present invention, since the cutouts are connected with the voids and the insulating layers fill at least the cutouts, the voids can be kept at least partially void. Thus, they can reduce parasitic capacitance between the node contacts, prevent the degradation of data retention properties of the memory device, and overcome the problem of malfunctioning. Additionally, the need to avoid the formation of voids in the node contacts by imposing strict requirements on the process for forming the node contacts can be dispensed with, thus widening the process window for the formation of the node contacts. Further, even when the voids are totally filled by the insulating layer, the portions of the insulating layers in the voids can still contribute to the isolation of adjacent ones of the node contacts without adversely affecting electrical conduction properties of the memory device.

BRIEF DESCRIPTION OF THE DRAWINGS

FIGS. 2a to 2d are schematic cross-sectional views of intermediate structures of the memory device of FIG. 2e taken along line a-a' and/or line b-b'.

In these figures,
100—substrate; AA—active area; SIT—trench isolation structure; 300—spacing insulation pillar; 500—isolation layer; 510—isolation material layer; 600—node contact window; 800, 810, 820—void; 900—cutout; 910—insulating layer;

WL—word line; 200a—gate oxide layer; 200b—gate conductive layer; 200c—gate insulating layer;
BL—bit line; 400a—first bit line conductive layer; 400b—second bit line conductive layer; 400c—third bit line conductive layer; 400d—bit line shielding layer; 400e—spacer;
SC—node contact; 700a—first conductive material layer; 700b—second conductive material layer; 700c—conductive contact layer;
X1—maximum width of an upper node contact portion;
X2—maximum width of a lower node contact portion.

DETAILED DESCRIPTION

Specific embodiments of the present invention will be described in greater detail below with reference to the accompanying drawings. Advantages and features of the present invention will be more apparent from the following detailed description. Note that the figures are provided in a very simplified form not necessarily drawn to exact scale, and they are only intended to facilitate convenience and clarity in explaining the disclosed embodiments.

Embodiment 1

Figure 2A:
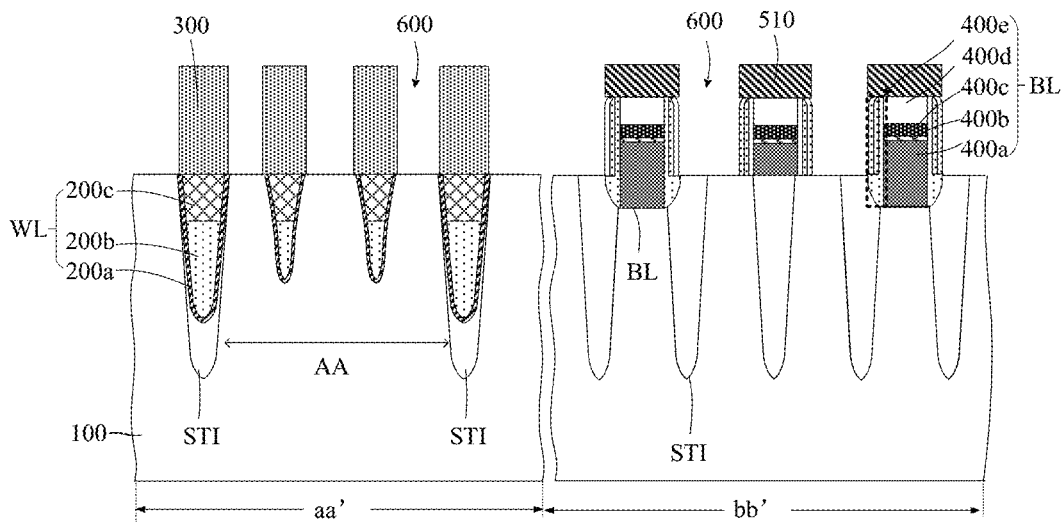
FIGS. 2a to 2d are schematic illustrations of structures formed in the method according to the first embodiment of the present invention.
Figure 2B:
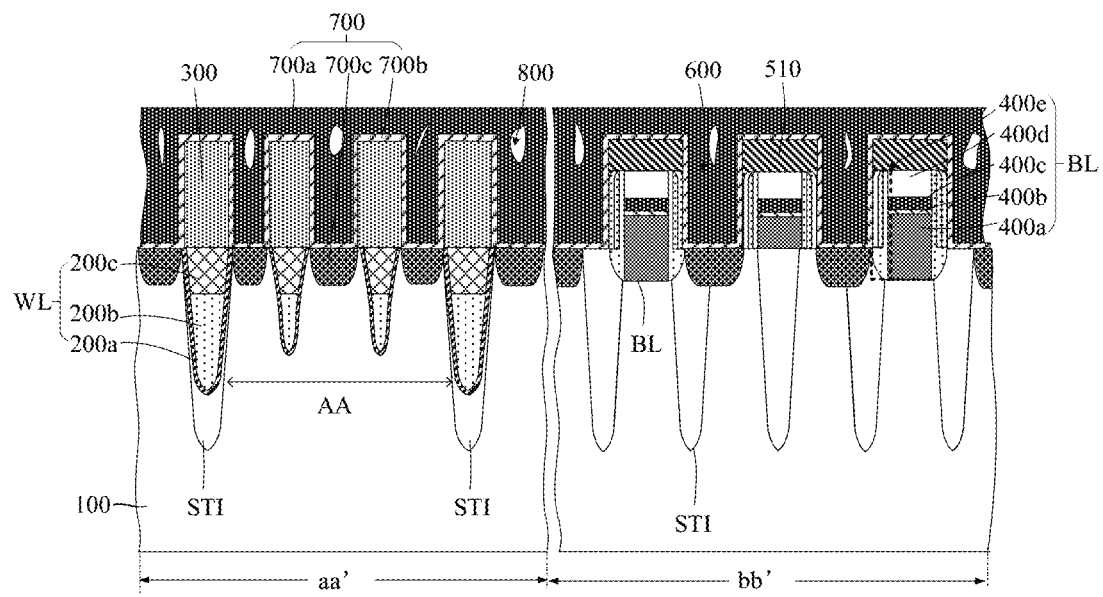
Figure 2C:
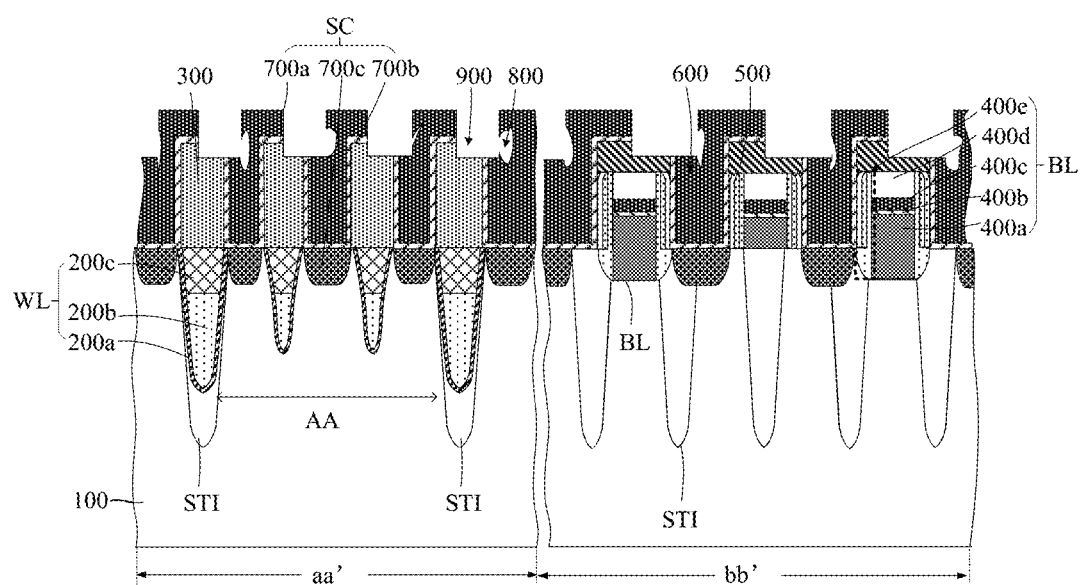
Figure 2D:
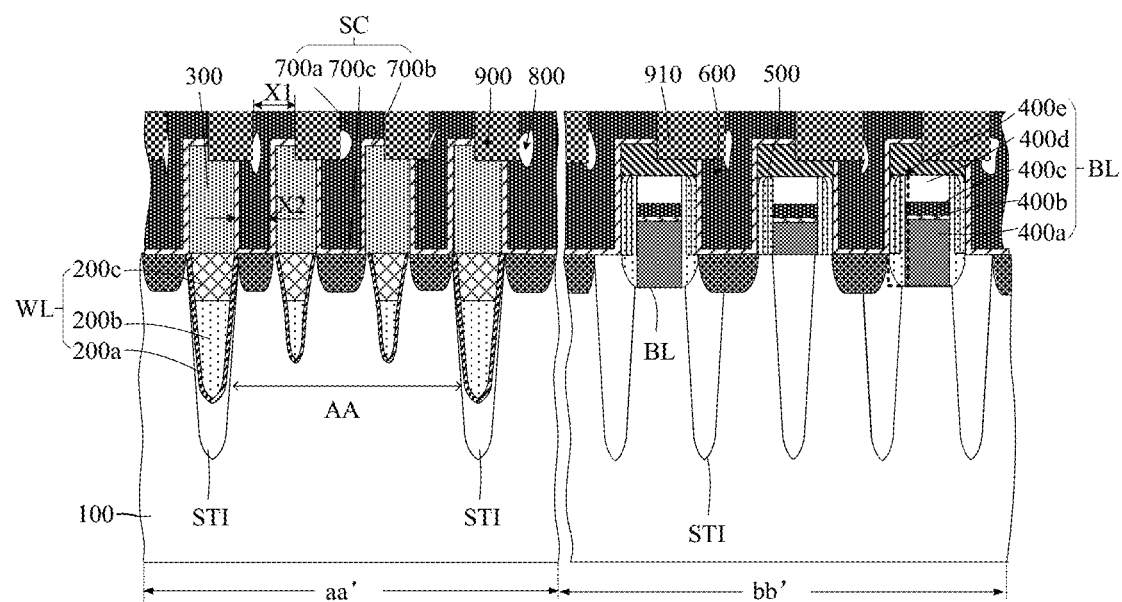
Figure 2E:
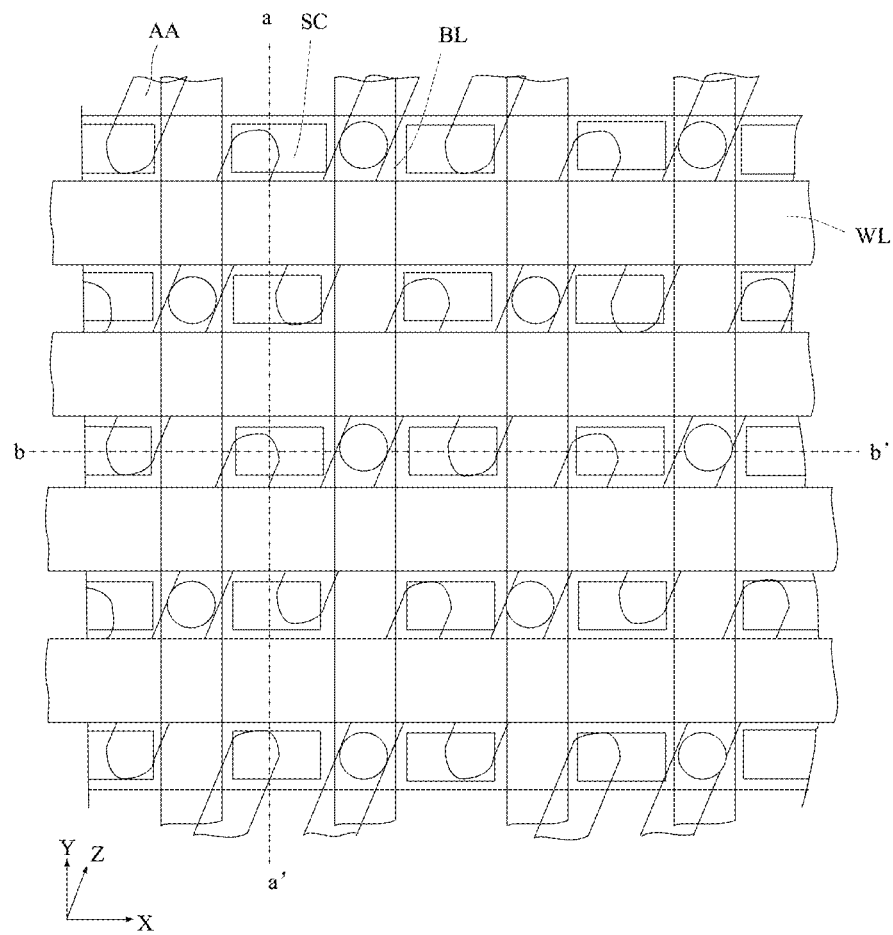
FIG. 2e is a simplified diagram of the memory device according to the first embodiment of the present invention.

FIG. 2d is a partially schematic diagram of the structure of a memory device according to this embodiment. FIG. 2e is a simplified diagram of the memory device of FIG. 2d, and FIG. 2d is a schematic cross-sectional view of the memory device of FIG. 2e taken along lines a-a' and b-b'.

As shown in FIGS. 2d and 2e, the memory device includes a substrate 100 and word lines WL formed in the substrate 100. In the substrate 100, a plurality of active areas AA extending in a third predetermined direction (Z) and trench isolation structures STI separating adjacent ones of the active areas AA are formed. The active areas AA are arranged in an array and individually isolated from one another by the trench isolation structures STI in order to avoid cross talk between the active areas AA.

Additionally, there are also word line trenches in the substrate 100, in which the respective word lines WL are formed. Specifically, each of the word line trenches extends in a first predetermined direction (X) across corresponding ones of the active areas AA and corresponding ones of the trench isolation structures STI so as to have portions in the trench isolation structures STI and portions in the active areas AA.

In this embodiment, each of the word line trenches has a greater opening size in the portions in the trench isolation structures STI than in the portions in the active areas AA. Additionally, each of the word line trenches is located at the bottom lower in the portions in the trench isolation structures STI than in the portions in the active areas AA.

As described above, each of the word line trenches extends across corresponding ones of the active areas AA and corresponding ones of the trench isolation structures STI. Accordingly, each of the word lines WL also extends across corresponding ones of the active areas AA and corresponding ones of the trench isolation structures STI. In this embodiment, each of the word lines WL is located at the bottom lower in portions in the trench isolation structures STI than in portions in the active areas AA and kept equally high at the top in all of the portions. Forming the word lines WL in the word line trenches allows the formation of curved channel regions in the active areas AA. Therefore, compared with the linear channel regions, the curved channel regions can have a relatively larger length, which can improve the short-channel effects of the transistors.

With continued reference to FIGS. 2*d* and 2*e*, each word line WL includes: a gate dielectric layer 200*a*, a gate conductive layer 200*b* and a gate insulating layer 200*c*, wherein the gate dielectric layer 200*a* covers an inner surface of the corresponding word line trench; the gate conductive layer 200*b* is formed on the gate dielectric layer 200*a* and fills a partial depth of the word line trench; and the gate insulating layer 200*c* is formed on the gate conductive layer 200*b* and fills the remainder of the word line trench.

For example, the active areas AA may be configured for storage transistors to be formed therein. In this case, source/drain regions including first source/drain regions and second source/drain regions are formed in the active areas AA, the first source/drain regions and the second source/drain regions are formed on opposing sides of the word lines WL to form the storage transistors. It could be appreciated that the first and second source/drain regions may be located at the bottom lower than tops of the gate conductive layers 200*b* so that there are equally high portions of the first and second source/drain regions and the gate conductive layers 200*b*.

With continued reference to FIGS. 2*d* and 2*e*, a plurality of bit lines BL are formed on the substrate 100, each extending in a second predetermined direction (Y) across corresponding ones of the active areas AA. Referring to FIG. 2*d*, each bit line BL includes a first bit line conductive layer 400*a*, a second bit line conductive layer 400*b* and a third bit line conductive layer 400*c*, which are sequentially stacked together in this order. The first bit line conductive layer 400*a* may be made of a material including, for example, doped polysilicon. The second bit line conductive layer 400*b* may be made of a material including, for example, titanium nitride. The third bit line conductive layer 200*c* may be made of a material including, for example, tungsten.

Each bit line BL further includes a bit line shielding layer 400*d* and a spacer 400*e*. The bit line shielding layer 400*d* is formed on the sequential stack of the bit line conductive layers, and the spacer 400*e* covers at least side surfaces of the sequential stack of the bit line conductive layers and of the bit line shielding layer 400*d*.

Each bit line BL has portions above the corresponding trench isolation structures STI and portions in the corresponding active areas AA. That is, each bit line BL is situated partially on the substrate 100 right above the corresponding trench isolation structures STI and partially extends from the substrate 100 into the corresponding active areas AA between adjacent one of the word lines WL.

With continued reference to FIGS. 2*d* and 2*e*, a plurality of spacing insulation pillars 300 are formed on the substrate 100 and extend in the first predetermined direction, and each of the spacing insulation pillars 300 is located right above the word lines WL.

The spacing insulation pillars 300 and the bit lines BL together delimit node contact windows 600 in which node contacts SC are formed. For example, the directions of extension of the spacing insulation pillars 300 and of the bit lines BL may be perpendicular to each other (i.e., the first predetermined direction may be perpendicular to the second predetermined direction) so that the spacing insulation pillars 300 and the bit lines BL intersect with each other to delimit the node contact windows 600.

At least some of the node contact windows 600 are located at the bottom within the substrate 100. The delimited node contact windows 600 are aligned along both the first and second predetermined directions and thus the node contact windows 600 are, for example, arranged in an array to form a node contact window array. In this case, it can be considered that the node contact windows 600 are arranged in multiple rows along both the first and second predetermined directions.

With continued reference to FIG. 2*e*, the node contacts SC are filled in the respective node contact windows 600. Accordingly, they are also arranged in multiple rows and electrically connected to the respective active areas AA.

With continued reference to FIG. 2*d*, the memory device further includes isolation layers 500 covering top surfaces of the respective bit lines BL. In this embodiment, the isolation layers 500 reside on the bit line shielding layers 400*d* of the respective bit lines BL. As described above, the node contact windows 600 are defined between adjacent bit lines BL. Thus, it can be considered that, with the isolation layers 500 on the bit lines BL, the node contact windows 600 have an increased depth.

With continued reference to FIG. 2*d*, the node contacts SC are filled in the respective node contact windows 600. In this embodiment, the node contacts SC are arranged in an array to form a node contact array. Each node contact SC is located at the top above tops edges of the respective node contact window 600.

With continued reference to FIG. 2*d*, each node contact SC includes a conductive contact layer 700*c*, the conductive contact layer 700*c* fills a partial depth of the respective node contact window 600 so as to be electrically connected to a corresponding one of the active areas AA. Each node contact SC further includes an electrically conductive layer, which is filled in the node contact window 600 and resides on the conductive contact layer 700*c* so as to be electrically connected to the conductive contact layer 700*c*. In this embodiment, the electrically conductive layer includes a first conductive layer 700*a* and a second conductive layer 700*b*. The second conductive layer 700*b* covers an inner surface of the node contact window 600, and the first conductive layer 700*a* fills the node contact window 600 and protrudes upward out of the node contact window 600.

In addition, adjacent ones of the node contacts SC are separated apart by cutouts 900. In this embodiment, some of the cutouts 900 extend from top surfaces of corresponding ones of the node contacts SC into isolation layers 500 on corresponding ones of the bit lines BL (accordingly, each of these isolation layers 500 is partially cut away), and the other cutouts 900 extend from top surfaces of corresponding ones of the node contacts SC into corresponding ones of the spacing insulation pillars 300 (accordingly, each of these spacing insulation pillars 300 is partially cut away). As such, adjacent ones of the node contacts SC are separated apart by the cutouts 900.

With continued reference to FIG. 2*d*, in this embodiment, the cutouts 900 are situated above the bit lines BL and the spacing insulation pillars 300. However, in the direction perpendicular to the height-wise direction, the cutouts 900 are located at the bottom below tops of the corresponding isolation layers 500 or spacing insulation pillars 300. Moreover, the cutouts 900 corresponding to the bit lines BL are not aligned with the bit lines BL but staggered a distance to the right relative to the bit lines BL. Likewise, the cutouts 900 corresponding to the spacing insulation pillars 300 are also not aligned with the spacing insulation pillars 300 but staggered a distance to the right relative to the spacing insulation pillars 300. As a result, in a plan view, the cutouts 900 are arranged not in an array but in a honeycomb pattern, which can result in area savings and a reduction in the device's footprint. Of course, in other embodiments, without limitation, the cutouts 900 corresponding to the bit lines BL may be aligned with the bit lines BL in the height-wise direction. Likewise, the cutouts 900 corresponding to the spacing insulation pillars 300 may be aligned with the spacing insulation pillars 300.

It should be understood that the cutouts 900 corresponding to the bit lines BL may be located at the bottom at least above bottoms of the isolation layers 500 so that the isolation layers 500 at least cover the bit lines BL, thus protecting the bit lines BL from external interference such as from moisture or signals.

In this embodiment, each of the node contacts SC includes an upper node contact portion and a lower node contact portion, the upper node contact portion is formed above the bottom of the corresponding cutout 900 and the lower node contact portion is formed under the bottom of the corresponding cutout 900. This can also be interpreted as each of node contacts SC being divided into the upper and lower node contact portions by the bottom of the corresponding cutout 900. In the direction perpendicular to the height-wise direction, the upper node contact portion has a maximum width X1 greater than a maximum width X2 of the lower node contact portion. This can result in reduced difficulties in the fabrication of the node contacts 300b.

With continued reference to FIG. 2d, in each of the node contacts SC, an void 800 is formed. In this embodiment, the void 800 is located at an open end of the corresponding node contact window 600. Moreover, the void 800 is positioned around a centerline of the corresponding node contact window 600. That is, the void 800 is not closer to any side wall of the node contact window 600 so that the void 800 can be brought into communication with the corresponding cutout 900 that is staggered to the right relative to the corresponding spacing insulation pillar 300 or bit line BL.

Of course, according to the present invention, the void 800 is not limited to being located around the centerline of the node contact window 600, as it may also be positioned close to a side wall of the node contact window 600. In this case, the cutouts 900 may be aligned with the spacing insulation pillars 300 and bit lines BL so that the cutouts 900 can also be brought into communication with the respective voids 800.

It should be understood that, without limitation, the voids 800 in the node contacts SC may be identical or different in terms of size and shape. Moreover, the voids 800 are not limited to being located at the open ends of the corresponding node contact windows 600. Rather, they may also be situated within the node contact windows 600.

In this embodiment, some of the cutouts 900 are located at the bottom below bottoms of the corresponding voids 800, while some of the cutouts 900 are located at the bottom above bottoms of the corresponding voids 800. Of course, in other embodiments, without limitation, the bottoms of the cutouts 900 may also be aligned with the bottoms of the voids 800.

With continued reference to FIG. 2d, insulating layers 910 are formed in the respective cutouts 900 in such a manner that the insulating layers 910 fill the cutouts 900 to electrically isolate adjacent ones of the node contacts SC. In this embodiment, the insulating layers 910 may be made of silicon oxide. Optionally, without limitation, the insulating layer 910 may also be made of nitride, a carbon-doped nitride (e.g., carbon-doped silicon nitride), a carbide (e.g., silicon carbide) or another oxide (e.g., tantalum oxide, titanium oxide or the like).

Additionally, without limitation, each insulating layer 910 may be either made up of a single layer or implemented as a composite film consisting of at least two layers, such as a composite oxide/nitride film.

With continued reference to FIG. 2d, in this embodiment, the insulating layers 910 block the connections between the voids 800 and the respective cutouts 900. In other words, the insulating layers 910 fill only the cutouts 900 without extending into the voids 800. In this way, the connections between the voids 800 and the respective cutouts 900 are blocked, thus closing the voids 800. It could be appreciated that, since the closed voids 800 are located between the respective insulating layers 910 and the respective node contacts SC, they will not affect electrical conduction properties of the node contacts SC. At the same time, between any two adjacent ones of the node contacts SC, there will be one of the voids 800. Since the voids 800 have a lower dielectric constant than the insulating layers 910, parasitic capacitance between adjacent node contacts SC are reduced, thus preventing the degradation of data retention properties of the memory device and overcoming the problems of malfunctioning.

Figure 1:
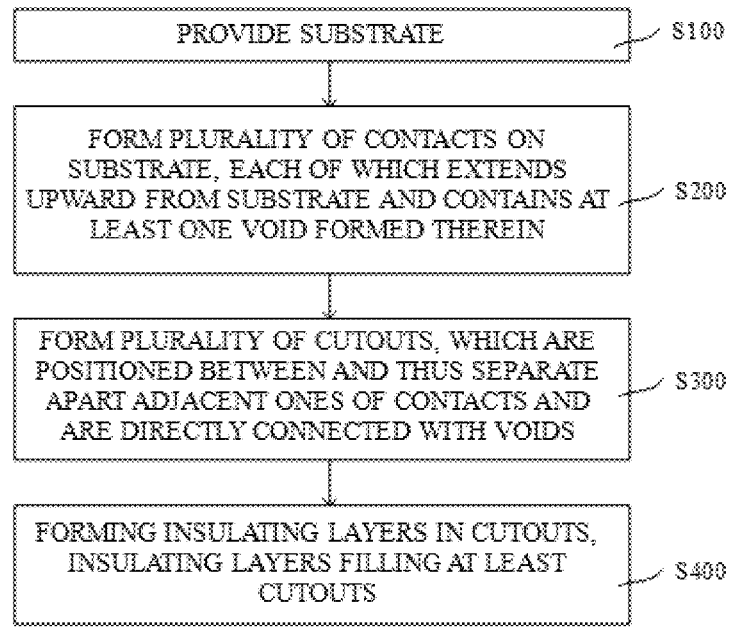
FIG. 1 is a flowchart of a method of fabricating a memory device according to a first embodiment of the present invention.

A method of fabricating the memory device as defined above will be described in detail below with reference to FIGS. 1 and 2a to 2e. FIG. 1 is a flowchart of the method according to an embodiment of the present invention, and FIGS. 2a to 2e are schematic illustrations of structures formed during the method.

As shown in FIG. 1, the method of fabricating the memory device includes the steps of:

S100) providing the substrate;

S200) forming the node contacts on the substrate, which extend upward from the substrate and contain the voids formed therein;

S300) forming the cutouts between adjacent ones of the node contacts, which electrically isolate the node contacts and communicate with the voids; and S400) forming the insulating layers in the cutouts, which fill at least the cutouts.

Specifically, with reference to FIG. 2a, step S100 is first performed, in which the substrate 100 is provided, in which the trench isolation structures STI delimiting the active areas AA extending in the third predetermined direction are formed.

With continued reference to FIG. 2a, the word lines WL are formed in the substrate 100, each extending in the first predetermined direction across corresponding ones of the active areas AA and corresponding ones of the trench isolation structures STI. Moreover, each word line WL has a transverse width (i.e., a width along the direction perpendicular to the height-wise direction) in portions in the corresponding active areas AA, which is smaller than a transverse width of the word line WL in portions in the corresponding trench isolation structures STI. Further, each word line WL is located at the bottom lower in the portions in the active areas AA than in the portions in the trench isolation structures STI.

The formation of the word lines WL may include the steps of:

forming the word line trenches (not shown) in the substrate 100 and the word line trenches extend along the first predetermined direction;

forming the gate dielectric layers 200a over the substrate 100, the gate dielectric layers 200a cover the inner surfaces of the respective word line trenches and the gate dielectric layers 200a serve to separate the word lines from the active areas AA;

forming the gate conductive layers 200b in the respective word line trenches, wherein each of the gate conductive layers 200b may be made of a conductive material such as polysilicon, tungsten or the like, and the gate conductive layers 200b may fill a partial depth of a corresponding one of the word line trenches, and wherein, for example, an etch-back process may be employed to lower top surfaces of the gate conductive layers 200b in the word line trenches to a level below a surface of the substrate 100 so that lower portions of the word line trenches are filled by the respective gate conductive layers 200b, with upper portions thereof remaining void; and forming the gate insulating layers 200c on the respective gate conductive layers 200b. The gate insulating layers 200c completely fill the respective word line trenches, and the gate dielectric layers 200a, the gate conductive layers 200b and the gate insulating layers 200c together form the word lines WL.

It is to be noted that, while not shown, during the formation of the word line trenches in the substrate 100 by etching the substrate 100, there is generally a mask layer over the surface of the substrate 100 in order to prevent other portions of the substrate 100 from being etched away undesirably.

With continued reference to FIG. 2a, the method of fabricating the memory device further includes forming the source/drain regions in the substrate 100, each of which has a side boundary contiguous with an upper side surface portion of a corresponding one of the word line trenches close to an open top end of the word line trench and a bottom boundary below tops of the gate conductive layers 200b. As such, there are equally high portions of the source/drain regions and the gate conductive layers 200b, which are separated from one another by the gate dielectric layers 200a.

Specifically, the source/drain regions include first source/drain regions S/D1 and second source/drain regions S/D2, which are located on opposing sides of the respective word lines WL. In this embodiment, the side boundaries of the first source/drain regions S/D1 are further contiguous with side surfaces of the trench isolation structures STI.

It is to be noted that, in this embodiment, the source/drain regions are formed subsequent to the successive formation of the word line trenches and the word lines WL. However, in other embodiments, without limitation, the formation of the source/drain regions may also precede that of the word line trenches and the word lines WL.

With continued reference to FIG. 2a, the spacing insulation pillars 300 and bit lines BL are further formed on the substrate 100. The spacing insulation pillars 300 and bit lines BL both extend in the second predetermined direction and together delimit the node contact windows 600 on the substrate 100. The node contact windows 600 are aligned and arranged in multiple rows along both the first and second predetermined directions.

The spacing insulation pillars 300 are located on the respective word lines WL and the spacing insulation pillars 300 are aligned with the word lines WL along the heightwise direction, while the bit lines BL cross over the word lines WL at right angles.

Specifically, in order to form the bit lines BL, respective bit line trenches are formed first. Since the bit lines BL are to be subsequently formed in the respective bit line trenches, the bit line trenches also extend in the second predetermined direction. The bit line trenches extend partially in portions of the active areas AA in the substrate 100 between adjacent ones of the word lines WL and partially above the trench isolation structures STI.

Afterwards, the bit lines BL are formed in the respective bit line trenches. Each of the bit lines BL includes three conductive material layers, which are sequentially stacked together. According, each bit line BL includes a first bit line conductive layer 400a, a second bit line conductive layer 400b and a third bit line conductive layer 400c. Each bit line BL further includes a bit line shielding layer 400d, which is a patterned layer formed on the stack of the three conductive material layers. Optionally, for example, the patterned bit line shielding layer 400d may be used to successively pattern the underlying conductive material layers. In this embodiment, the formation of the bit lines BL further includes forming spacers 400e over side surfaces of the first bit line conductive layers 400a, the second bit line conductive layers 400b, the third bit line conductive layers 400c and the bit line shielding layers 400d.

With continued reference to FIG. 2a, in this embodiment, top surfaces of the spacing insulation pillars 300 are flush with one another and higher than top surfaces of the bit lines BL. Accordingly, isolation material layers 510 are formed on the respective bit lines BL so that the top surfaces of the bit lines BL are flush with the top surfaces of the spacing insulation pillars 300. The isolation material layers 510 and the underlying bit lines BL define a plurality of separation lines together with the spacing insulation pillars 300, which delimit the node contact window array. In a specific embodiment, the isolation material layers 510 and the underlying bit lines BL may define first separation lines extending along the direction of extension of the bit lines (e.g., the second predetermined direction), and the spacing insulation pillars 300 may define second separation lines, which extend, for example, in the first predetermined direction and intersect with the first separation lines, thus delimiting the node contact window array.

Referring to FIG. 2b, in step S200, after the node contact window array is delimited, an etching process is performed on the substrate 100 at bottoms of the node contact windows 600 so that at least some of the node contact windows 600 are deepened into corresponding active areas in the substrate 100, so that better electrical connections can be established between the node contacts and the active areas AA.

With continued reference to FIG. 2b, steps S200 and S300 are performed to form a conductive material layer 700 over the substrate 100. The conductive material layer 700 fills the node contact windows 600 and cover both the bit lines BL and spacing insulation pillars 300. The conductive material layer 700 is formed to provide the node contacts. It may be formed of a silicon-containing conductive material such as amorphous silicon or polysilicon, or a metallic conductive material. For example, without limitation, the conductive material layer 700 may have a lower portion made of a silicon-containing conductive material and an upper portion made of tungsten or another conductive material with a low resistivity. Additionally, without limitation, a metal silicide layer may be formed between the upper and lower portions of the conductive material layer 700 as needed for reducing contact resistance between the silicon-containing conductive material and the metallic conductive material.

With continued reference to FIG. 2b, specifically, an electrically conductive layer (including a first conductive layer 700a and a second conductive layer 700b in accordance with this embodiment) may be so formed as to fill part of each of the node contact windows and extend over the isolation material layers 510 and the spacing insulation pillars 300.

Optionally, prior to the formation of the electrically conductive layer, the method further includes forming the conductive contact layers 700c in the respective node contact windows. That is, in this embodiment, the electrically conductive layer is formed on the conductive contact layers 700c and forms the conductive material layer 700 together with the conductive contact layers 700c.

The formation of the conductive contact layers 700c may include at least partially filling the node contact windows 600 with the conductive contact layers 700c. In this embodiment, the conductive contact layers 700c filled in the node contact windows 600 are electrically connected to the active areas exposed in the node contact windows 600.

With continued reference to FIG. 2b, the formation of the electrically conductive layer may follow the formation of the conductive contact layers 700c. In this embodiment, the formation of the electrically conductive layer may include the steps of:

i) forming the second conductive layer 700b, which covers side surfaces of the node contact windows 600 and tops of the conductive contact layer 700c; and ii) forming the first conductive layer 700a, which fills the node contact windows 600 and covers top surfaces of the isolation material layers 510. In this embodiment, the first conductive layer 700a may be planarized.

It should be understood that, with the increasing miniaturization of semiconductor devices, the node contact windows 600 are required to have an increasingly high depth-to-width aspect ratio. For this reason, very strict requirements are placed on the process for forming the first conductive layer 700a in order to avoid the formation of voids in the first conductive layer 700a, which may affect electrical conduction properties of the subsequently formed node contacts. By contrast, according to this embodiment, the process for forming the first conductive layer 700a is not imposed with strict requirements, and the voids formed in the first conductive layer 700a will not become an issue. In this embodiment, the voids 800 are formed in portions of the first conductive layer 700a corresponding to the node contact windows 600. The voids 800 are formed at the open ends of the node contact windows 600. As detailed below, the voids 800 will not affect the electrical conduction properties of the node contacts.

Referring to FIGS. 2b and 2c, the cutouts 900 are formed by etching away portions of the conductive material layer 700 (more precisely, of the first conductive layer 700a), partial thicknesses of the isolation material layers 510 on the bit lines BL and partial thicknesses of the spacing insulation pillars 300, the cutouts 900 correspond to the bit lines BL and the spacing insulation pillars 300. As shown in FIG. 2c, the cutouts 900 separate the remaining portions of the conductive material layer 700 apart, which form the node contacts SC. As such, the node contacts SC are each electrically isolated by the cutouts 900.

With continued reference to FIG. 2c, the remainders of the isolation material layers 510 from the etching away of the partial thicknesses thereof form the respective isolation layer 500. The isolation material layers 510 and the spacing insulation pillars 300 between adjacent ones of the remaining portions of the electrically conductive layer may be further etched to effectively remove the conductive material between these adjacent portions and ensure sufficient isolation between the adjacent portions of the electrically conductive layer.

With continued reference to FIG. 2c, in this embodiment, in the direction perpendicular to the height-wise direction (i.e., the direction of extension of the substrate 100), the bit lines BL are staggered from the respective corresponding cutouts 900 (the cutouts 900 are offset to the right from the respective bit lines BL), and the spacing insulation pillars 300 are also staggered from the respective corresponding cutouts 900 (the cutouts 900 are offset to the right from the respective spacing insulation pillars 300). This can widen the process window for the cutouts 900 and result in area savings. Moreover, the offsetting of the cutouts 900 allows easy access of the etching process for forming the cutouts 900 to the voids 800. In this way, the cutouts 900 can be brought into communication with the voids 800.

Of course, without limitation, the bit lines BL may be alternatively and optionally aligned with the respective cutouts 900 in the height-wise direction. Likewise, the spacing insulation pillars 300 may also be aligned with the respective cutouts 900.

Referring to FIG. 2d, the insulating layers 910 are formed in the respective cutouts 900. In this embodiment, for example, the formation of the insulating layers 910 may include: depositing an insulating material layer, which fills the cutouts 900 and covers tops of the node contacts SC; and then performing an etch-back process to remove the insulating material deposited on and above the tops of the node contacts SC.

With continued reference to FIG. 2d, in this embodiment, the insulating layers 910 fill only the cutouts 900, without extending into the voids 800. In this way, the insulating layers 910 block the connections between the voids 800 and the cutouts 900, thus again closing the voids. Additionally, the voids 800 are formed between adjacent ones of the node contacts SC and thus reduce parasitic capacitance between the adjacent ones of the node contacts SC. Further, since the voids 800 are not in the node contacts SC, they will not adversely affect the electrical conduction properties of the node contacts SC.

Embodiment 2

Figure 3:
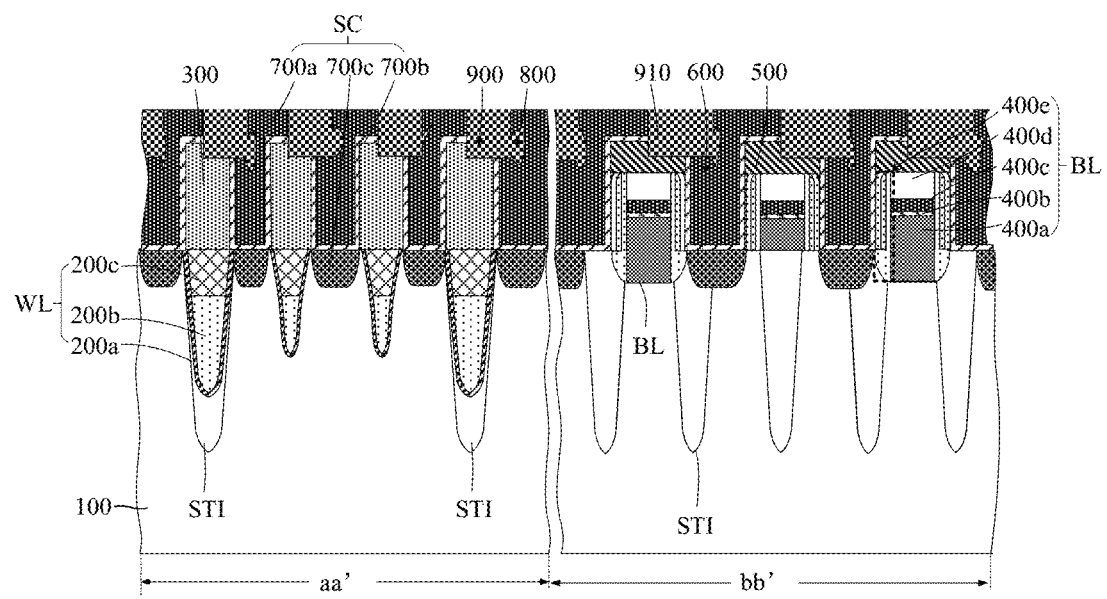
FIG. 3 is a structural schematic of a memory device according to a second embodiment of the present invention.

FIG. 3 is a partial structural schematic of a memory device according to this embodiment. As shown in FIG. 3, differing from Embodiment 1, the insulating layers 910 fill both the cutouts 900 and the voids 800 in this embodiment.

Specifically, referring to FIG. 3, in addition to filling the cutouts 900, the insulating layers 910 further extend from the connections between the cutouts 900 and the voids 800 into the voids 800 and completely fill the voids 800. It could be appreciated that, in this case, the voids 800 are also filled with the insulating material, and the cutouts 900 and the voids 800 both function to separate adjacent ones of the node contacts SC. In this embodiment, although the voids 800 are incapable of reducing parasitic capacitance between adjacent ones of the node contacts SC, they will not adversely affect electrical conduction properties of the node contacts SC.

With continued reference to FIG. 3, the memory device of this embodiment may be made using a method similar to that of Embodiment 1, except that parameters of the process for forming the insulating layers 910 are controlled to facilitate extension of the insulating layers 910 into the voids 800 and complete filling of the voids 800 thereby. For example, a deposition process with good trench filling capabilities or a lower deposition rate may be used to form the insulating layers 910 so that the insulating layers 910 fill both the cutouts 900 and the voids 800.

Embodiment 3

Figure 4:
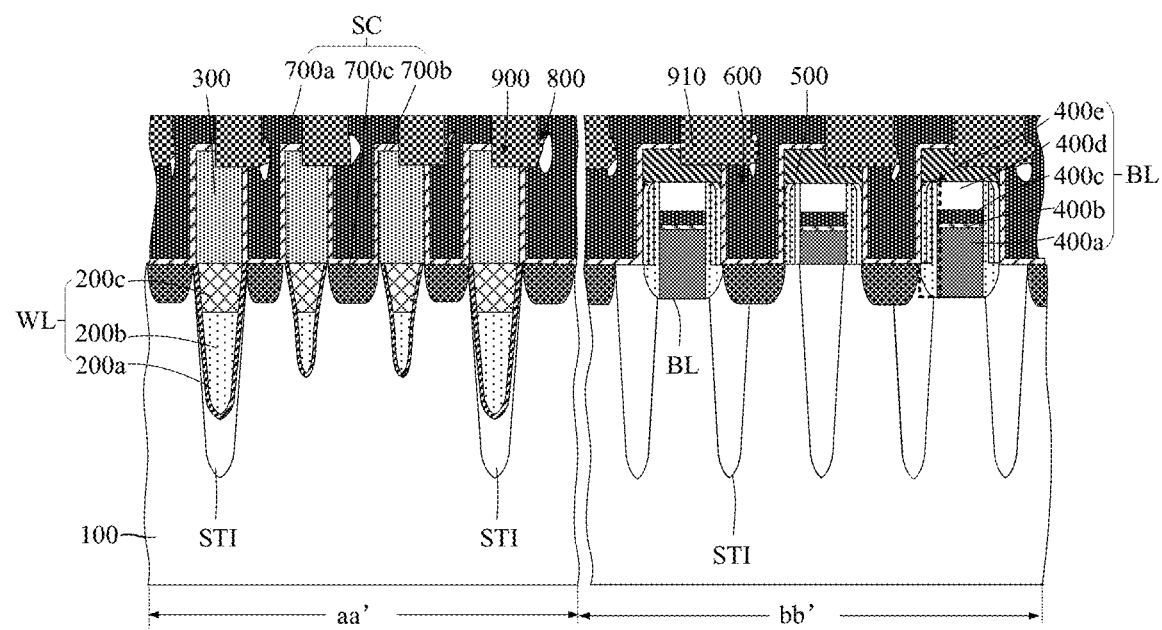
FIG. 4 is a structural schematic of a memory device according to a third embodiment of the present invention.

FIG. 4 is a partial structural schematic of a memory device according to this embodiment. As shown in FIG. 4, differing from Embodiments 1 and 2, the insulating layers 910 fill the cutouts 900 and partially fill the voids 800 in this embodiment.

Specifically, referring to FIG. 4, in addition to filling the cutouts 900, the insulating layers 910 further extend from the connections between the cutouts 900 and the voids 800 into the voids 800 and partially fill the voids 800. In this case, each of the voids 800 is partially filled and partially remains void. Therefore, they can reduce parasitic capacitance between adjacent ones of the node contacts SC while not adversely affecting electrical conduction properties of the node contacts SC.

Specifically, the insulating layers 910 may, for example, cover inner surfaces of the voids 800, leaving central regions of the voids 800 unfilled. Alternatively, the insulating layers 910 may fill upper portions of the voids 800, with the lower portions of the voids 800 remaining void. Still alternatively, each of the voids 800 may be split by a corresponding one of the insulating layers 910 into two separate parts. Of course, this embodiment is not limit to the above three filling method, and the insulating layers 910 can fill the voids 800 in any possible manner.

With continued reference to FIG. 4, the memory device of this embodiment may be made using a method similar to that of Embodiment 1, except that parameters of the process for forming the insulating layers 910 are controlled to facilitate extension of the insulating layers 910 into the voids 800 and partially filling of the voids 800 thereby. For example, a deposition process with good trench filling capabilities may be used to form the insulating layers 910 so as to deposit the insulating material into the voids 800, and then the deposition rate may be increased to allow quick closure of the voids 800 by the formed insulating layers 910. Since the connections between the voids 800 and the cutouts 900 are small, they will be blocked when the voids 800 are partially filled by the insulating layers 910, resulting in partial filling of the voids 800. Alternatively, a deposition process with good trench filling capabilities may be used to form the insulating layers 910 so that the insulating material can enter the voids 800, a deposition process with good trench filling capabilities may be used to form the insulating layers 910 so as to deposit the insulating material into the voids 800, and then the deposition rate may be decreased. Moreover, upon the insulating layers 910 partially filling the voids 800 to a desired extent, the process may be ceased, resulting in partial filling of the voids 800.

Embodiment 4

Figure 5:
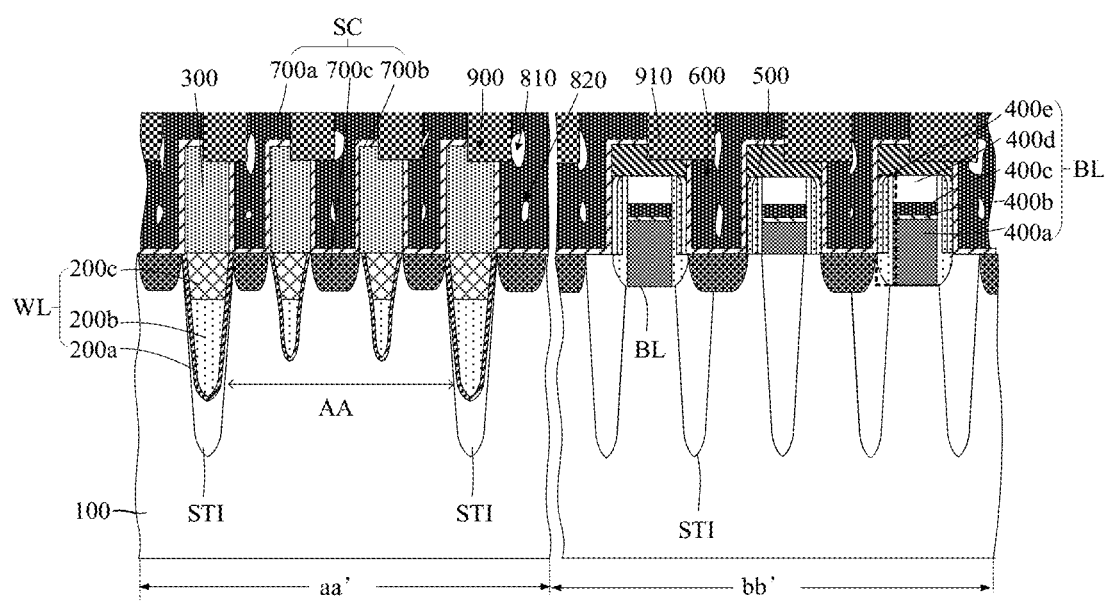
FIG. 5 is a structural schematic of a memory device according to a fourth embodiment of the present invention.

FIG. 5 is a partial structural schematic of a memory device according to this embodiment. As shown in FIG. 5, differing from Embodiments 1, 2 and 3, a first void 810 and a second void 820 are formed in each of the node contacts SC in this embodiment. Moreover, the first void 810 is located at the bottom above a top of the second void 820, and the cutouts 900 are in communication with at least the first voids 810.

Specifically, the first and second voids 810, 820 may be formed in the first conductive layers 700a. Additionally, the first voids 810 may be located at the open ends of the node contact windows 600, and the second voids 820 may be situated within the node contact windows 600. In this case, the first conductive layers 700a may be formed in a two-step manner, or may be composite films each consisting of more than one layer. When the node contact windows 600 have a large depth-to-width aspect ratio, satisfactory filling of the node contact windows 600 with the first conductive layers 700a would be difficult to achieve, and the first and second voids 810, 820 distributed along the height-wise direction tend to be formed in the first conductive layers 700a.

In this embodiment, the cutouts 900 communicate with only the first voids 810. Moreover, some of the cutouts 900 are located at the bottom below bottoms of the first voids 810 and above the tops of the second voids 820, while some of the cutouts 900 are located at the bottom above the bottoms of the first voids 810.

However, it should be understood that, according to the present invention, the cutouts 900 are not limit to being in communication with only the first voids 810. In case of the cutouts 900 being located at the bottom not lower than the tops of the bit lines BL (in order to ensure protection of the bit lines BL against external factors), it is also possible for the cutouts 900 to communicate with both the first and second voids 810, 820. In addition, without limitation, it is also possible for the cutouts 900 to be all located at the bottom below the bottoms of the first voids 810 and above the tops of the second voids 820, or to be all located at the bottom above the bottoms of the first voids 810.

With continued reference to FIG. 5, the memory device of this embodiment may be made using a method similar to that of Embodiment 1, except that during the formation of the first conductive layers 700a in the node contact windows 600, the second voids 820 are formed in portions of the first conductive layers 700a within the node contact windows 600, and the first voids 810 are formed in portions of the first conductive layers 700a at the open ends of the node contact windows 600. Moreover, whether the cutouts 900 are in communication with the second voids 820 depends upon the height level where the second voids 820 are located.

In summary, in the memory devices and methods according to the embodiments of the present invention, the plurality of node contacts containing the voids formed therein are formed on the substrate and electrically isolated from one another by the cutouts in communication with the voids, with the insulating layers filling at least the cutouts. According to the present invention, since the cutouts are in communication with the voids and the insulating layers fill at least the cutouts, the voids can be kept at least partially void. Thus, they can reduce parasitic capacitance between the node contacts, prevent the degradation of data retention properties of the memory device, and overcome the problem of malfunctioning. Additionally, the need to avoid the formation of voids in the node contacts by imposing strict requirements on the process for forming the node contacts can be dispensed with, thus widening the process window for the formation of the node contacts. Further, even when the voids are totally filled by the insulating layer, the portions of the insulating layers in the voids can still contribute to the isolation of adjacent ones of the node contacts without adversely affecting electrical conduction properties of the memory device.

It is noted that the embodiments disclosed herein are described in a progressive manner, with the description of each embodiment focusing on its differences from others. Reference can be made between the embodiments for their identical or similar parts. Since the system embodiments correspond to the method embodiments, they are described relatively briefly, and reference can be made to the method embodiments for details in the system embodiments.

It is also to be noted that, while the invention has been described with reference to several preferred embodiments, it is not intended to be limited to these embodiments in any way. In light of the teachings hereinabove, any person of skill in the art may make various possible variations and changes to the disclosed embodiments or modify them into equivalent alternatives, without departing from the scope of the invention. Accordingly, any and all such simple variations, equivalent alternatives and modifications made to the foregoing embodiments without departing from the scope of the invention are intended to fall within the scope thereof.

It is to be noted that, as used herein, the terms "first", "second" and the like are only meant to distinguish various components, elements, steps, etc. from each other rather than necessarily indicate logical or sequential orderings thereof, unless otherwise indicated or specified.

It is also to be understood that the terminology used herein is used for the purpose of describing particular embodiments only, and is not intended to limit the scope of the present invention. It must be noted that as used herein and in the appended claims, the singular forms "a" and "an" include the plural reference unless the context clearly dictates otherwise. Thus, for example, a reference to "a step" or "a means" is a reference to one or more steps or means and may include sub-steps and subservient means. All conjunctions used are to be understood in the most inclusive sense possible. Thus, the term "or" should be understood as having the definition of a logical "or" rather than that of a logical "exclusive or" unless the context clearly necessitates otherwise. Implementation of the methods and/or device according to the embodiments of the present invention involves performing or completing certain selected tasks or steps manually, automatically, or a combination thereof.

Presented above are merely a few preferred embodiments of the present invention, which do not limit the invention in any way. Changes in any forms made to the principles and teachings disclosed herein, including equivalents and modifications, by any person of ordinary skill in the art without departing from the scope of the invention are intended to fall within the scope of the invention.

What is claimed is:
1. A memory device, comprising:
 a substrate;
 a plurality of contacts, extending upward from the substrate and each containing at least one void formed therein;
 a plurality of cutouts positioned between adjacent two of the plurality of contacts to separate apart the adjacent two of the plurality of contacts, and the plurality of cutouts directly connecting with the voids; and
 an insulating layer filling at least the plurality of cutouts.
2. The memory device of claim 1, wherein the insulating layer covers connections between the voids and the plurality of cutouts.
3. The memory device of claim 1, wherein the insulating layer completely fills the voids.
4. The memory device of claim 1, wherein each of the plurality of contacts is formed therein with a first void and a second void, the first void having a bottom higher than a top of the second void, and wherein the plurality of cutouts are directly connected with at least the first voids.
5. The memory device of claim 4, wherein each of the plurality of cutouts has a bottom lower than the bottom of the connected first void.
6. The memory device of claim 4, wherein each of the plurality of cutouts has a bottom higher than the bottom of the corresponding first void and higher than the top of the corresponding second void.
7. The memory device of claim 1, comprising:
 spacing insulation pillars extending in a first direction between the substrate and the plurality of cutouts.
8. The memory device of claim 1, wherein each of the plurality of contacts is divided into an upper contact portion and a lower contact portion at a height level corresponding to bottoms of the plurality of cutouts, the upper contact portion having a maximum width greater than a maximum width of the lower contact portion in the direction perpendicular to the height-wise direction.
9. A method of fabricating a memory device, the method comprising:
 providing a substrate;
 forming a plurality of contacts on the substrate, the plurality of contacts extending upward from the substrate and each containing at least one void formed therein;
 forming a plurality of cutouts, each positioned between adjacent two of the plurality of contacts to separate apart the adjacent two of the plurality of contacts, and the plurality of cutouts directly connecting with the voids; and
 forming an insulating layer in the plurality of cutouts, the insulating layer filling at least the plurality of cutouts.
10. The method of fabricating a memory device of claim 9, wherein during the formation of the insulating layer in the plurality of cutouts, the insulating layer covers connections between the voids and the plurality of cutouts, or the insulating layer covers connections between the voids and the plurality of cutouts and partially fills the voids.
11. The method of fabricating a memory device of claim 9, wherein during the formation of the insulating layer in the plurality of cutouts, the insulating layer further completely fills the voids.
12. The method of fabricating a memory device of claim 9, wherein each of the plurality of contacts is formed therein with a first void and a second void, the first void having a bottom higher than a top of the second void, and wherein the plurality of cutouts are directly connected with at least the first voids.
13. The method of fabricating a memory device of claim 12, wherein each of the plurality of cutouts has a bottom lower than the bottom of the connected first void.
14. The method of fabricating a memory device of claim 12, wherein each of the plurality of cutouts has a bottom higher than the bottom of the corresponding first void and higher than the top of the corresponding second void.
15. The method of fabricating a memory device of claim 9, wherein the plurality of contacts and plurality of cutouts are formed simultaneously, and the formation of the plurality of contacts and plurality of cutouts comprises the steps of:
 forming a conductive material layer on the substrate, the conductive material layer containing the voids; and
 forming the plurality of cutouts by etching the conductive material layer, the plurality of cutouts directly connected with the voids, the plurality of cutouts separating apart remaining portions of the conductive material layer, which form the plurality of contacts.
16. The method of fabricating a memory device of claim 15, further comprising:
 forming a plurality of spacing insulation pillars extending in a first direction and a plurality of bit lines extending in a second direction are on the substrate, the plurality of spacing insulation pillars and the plurality of bit lines together delimiting the contact windows;

forming a conductive material layer over the substrate, which fills the contact windows and extends over tops of the plurality of bit lines and of the plurality of spacing insulation pillars, wherein the voids are located in portions of the conductive material layer filled in the contact windows; and forming the plurality of cutouts by etching the conductive material layer, wherein the etching comprises etching away portions of the conductive material layer, partially etching away upper portions of the plurality of spacing insulation pillars and partially etching away upper portions of the plurality of bit lines, wherein in a direction perpendicular to a height-wise direction, the plurality of spacing insulation pillars are staggered with respect to respective corresponding ones of the plurality of cutouts and the plurality of bit lines are also staggered with respect to respective corresponding ones of the plurality of cutouts, thus bringing the plurality of cutouts directly connected with the voids.

17. The memory device of claim 1, wherein the insulating layer covers connections between the voids and the plurality of cutouts and partially fills the voids.

18. The memory device of claim 1, further comprising: bit lines extending in a second direction between the substrate and the plurality of cutouts,
wherein the plurality of contacts are formed in respective contact windows delimited by the spacing insulation pillars and the bit lines, and wherein in a direction perpendicular to a height-wise direction, the spacing insulation pillars are staggered with respect to respective corresponding ones of the plurality of cutouts and the bit lines are also staggered with respect to respective corresponding ones of the plurality of cutout.

19. The memory device of claim 7, wherein one of the voids is in a level between an interface of the spacing insulation pillar and the plurality of cutouts.

\* \* \* \* \*